(12) United States Patent
Liang et al.

(10) Patent No.: US 8,133,792 B2
(45) Date of Patent: Mar. 13, 2012

(54) METHOD FOR REDUCING CAPACITANCE VARIATION BETWEEN CAPACITORS

(75) Inventors: Victor-Chiang Liang, Hsinchu (TW); Chien-Kuo Yang, Taipei Hsien (TW); Hua-Chou Tseng, Hsinchu (TW); Chun-Yao Ko, Taoyuan County (TW); Cheng-Wen Fan, Tainan (TW); Yu-Ho Chiang, Taichung (TW); Chih-Yuh Tzeng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 714 days.

(21) Appl. No.: 11/309,164

(22) Filed: Jul. 4, 2006

(65) Prior Publication Data

US 2008/0012092 A1 Jan. 17, 2008

(51) Int. Cl.
*H01L 21/20* (2006.01)

(52) U.S. Cl. ........ 438/382; 438/253; 438/238; 438/396; 257/E21.008; 257/E21.009; 257/E21.021; 257/E21.048

(58) Field of Classification Search .................. 438/238, 438/253, 382, 396; 257/296, 298, 307, E21.008, 257/E21.009, E21.021, E27.048
See application file for complete search history.

(56) References Cited

U.S. PATENT DOCUMENTS

| 5,208,725 | A  | * | 5/1993  | Akcasu         | 361/313 |
|-----------|----|---|---------|----------------|---------|
| 6,297,524 | B1 |   | 10/2001 | Vathulya et al.|         |
| 6,383,858 | B1 | * | 5/2002  | Gupta et al.   | 438/238 |
| 6,614,645 | B1 | * | 9/2003  | Sakurai et al. | 361/328 |
| 6,661,079 | B1 |   | 12/2003 | Bikulcius      |         |
| 6,677,637 | B2 |   | 1/2004  | Bernstein et al.|        |
| 6,819,542 | B2 |   | 11/2004 | Tsai et al.    |         |
| 6,897,505 | B2 |   | 5/2005  | Aton           |         |
| 7,034,729 | B2 | * | 4/2006  | Gaggl et al.   | 341/143 |
| 7,446,365 | B1 | * | 11/2008 | Heshami et al. | 257/303 |
| 2004/0224474 | A1 | * | 11/2004 | Barth et al. | 438/396 |
| 2005/0064673 | A1 | * | 3/2005  | Burke et al.  | 438/393 |
| 2005/0259190 | A1 | * | 11/2005 | Wang et al.   | 349/38  |
| 2006/0234443 | A1 | * | 10/2006 | Yang et al.   | 438/253 |

* cited by examiner

*Primary Examiner* — Charles Garber
*Assistant Examiner* — Abdulfattah Mustapha
(74) *Attorney, Agent, or Firm* — WPAT, PC; Justin King

(57) ABSTRACT

A structure of a capacitor set is described, including at least two capacitors that are disposed at the same position on a substrate and include a first capacitor and a second capacitor. The first capacitor includes multiple first capacitor units electrically connected with each other in parallel. The second capacitor includes multiple second capacitor units electrically connected with each other in parallel. The first and the second capacitor units are arranged spatially intermixing with each other to form an array.

26 Claims, 9 Drawing Sheets

METHOD FOR REDUCING CAPACITANCE VARIATION BETWEEN CAPACITORS

BACKGROUND OF THE INVENTION

1. Field of the Invention

The present invention relates to a structure of an integrated circuit (IC) device. More particularly, the present invention relates to a structure of a capacitor set, and to a method for reducing the capacitance variation between capacitors.

2. Description of the Related Art

The capacitor is one of the major devices in integrated circuits. In applications of analog devices, the capacitors usually used include the metal-insulator-metal (MIM) capacitor and the metal-oxide-metal (MOM) capacitor. The fabricating process of a MOM capacitor can be integrated with the interconnect process, hence needing no extra photomask. On the contrary, a MIM capacitor process needs an extra photomask and an extra lithography process, and therefore costs more.

However, the fabricating process of either type of capacitor is easily affected by some variation factors, such as machine wearing and changes in raw materials, so that the capacitances of the capacitors are not uniform causing a relative variation that lowers the product performances. A relative capacitance variation between capacitors generally includes a local capacitance variation of short range and a global capacitance variation of long range. For example, through a capacitance match measurement to two capacitors in the same die, the capacitances of the two capacitors are found to be different causing a capacitance mismatch problem. For two capacitors within a short range, the relative capacitance variation between them is mostly due to the local capacitance variation.

The local capacitance variation usually can be decreased by increasing the area of each capacitor. The reason is given below in reference of FIG. 7, which shows an example of the capacitance of capacitor varying with the position within a short range in the prior art. In FIG. 7, the local capacitance variation between the two positions "a" and "b" is ΔC that is the difference between the capacitances at the two positions, while the local capacitance variation between the two regions A and B is ΔC' that is the difference between the mean capacitance in the region A and the mean capacitance in the region B and is smaller than ΔC. Accordingly, increasing the capacitor area can effectively lower the local capacitance variation. For MIM capacitors, increasing the capacitor area can effectively decreases the local capacitance variation; for MOM capacitors, however, increasing the capacitor area cannot effectively decreases the local capacitance variation. Moreover, with an increase in the capacitor area, the long-range global capacitance variation is adversely increased, so that the performances of the products are difficult to make uniform.

Accordingly, the statistical capacitance variation between capacitors are a very important issue to the performance of IC products. Hence, for current IC processes, it is much desired to lower the capacitance variations of the capacitors.

SUMMARY OF THE INVENTION

Accordingly, this invention provides a structure of a capacitor set that is capable of reducing the capacitance variation to improve the performance of the product.

This invention also provides a method for reducing the capacitance variation between capacitors, which makes the local capacitance variation decrease more effectively with an increase in the capacitor area as well as decreases the global capacitance variation.

The structure of a capacitor set of this invention includes at least two capacitors that are disposed at the same position on a substrate and include a first capacitor and a second capacitor. The first capacitor includes multiple first capacitor units that are electrically connected with each other in parallel. The second capacitor includes multiple second capacitor units that are electrically connected with each other in parallel. The first capacitor units and the second capacitor units are arranged spatially intermixing with each other to form an array.

In the above structure, the first and the second capacitor units may be arranged in a two-dimensional (2D) array in one plane, wherein the plane may be parallel or perpendicular to the surface of the substrate.

The first and the second capacitor units may alternatively be arranged in a three-dimensional (3D) array. In some embodiments, the first and the second capacitor units are arranged alternately in a first and a second dimensional directions of the 3D array but repeatedly in a third dimensional direction of the 3D array. In such cases, the first and the second dimensional directions may be parallel to the surface of the substrate and the third dimensional direction perpendicular to the surface of the substrate. Alternatively, the first and the third dimensional directions are parallel to the surface of the substrate and the second dimensional direction perpendicular to the surface of the substrate. In other embodiments, the first and the second capacitor units may be arranged alternately in each of the three dimensional directions of the 3D array, wherein the three dimensional directions may be perpendicular to each other and include two directions parallel to the substrate surface and one direction perpendicular to the substrate surface.

Moreover, the first capacitor units and the second capacitor units may be the same in the number and in the capacitance per capacitor unit. The first and the second capacitors may be MOM capacitors or MIM capacitors.

In addition, in a capacitor set structure of this invention, each of the first capacitor units may include a first electrode, a second electrode and a dielectric material between the first and the second electrodes, and each of the second capacitor unit may include a third electrode, a fourth electrode and the dielectric material between the third and the fourth electrodes. In the first capacitor units, all of the first electrodes are electrically connected with each other and all of the second electrodes are electrically connected with each other. In the second capacitor units, all of the third electrodes are electrically connected with each other and all of the fourth electrodes are electrically connected with each other. When the first and the second capacitors are both MOM capacitors, each of the first to fourth electrodes may have a comb-like structure.

The method for reducing the capacitance variation between capacitors of this invention includes forming at least a first and a second capacitors at the same position on a substrate, wherein multiple first capacitor units electrically connected with each other in parallel and multiple second capacitor units electrically connected with each other in parallel are formed to respectively constitute the first capacitor and the second capacitor. The first capacitor units and the second capacitor units are the same in number and in capacitance per capacitor unit, and are arranged spatially intermixing with each other to form an array.

In the above method of this invention, possible 2D or 3D arrangements of the first and the second capacitor units include those mentioned above, and the first and the second capacitors may be MOM capacitors or MIM capacitors. Moreover, the structure of one first/second capacitor unit and the structures of the electrodes in the capacitor units may be the same as those mentioned above.

In the above structure and method of this invention, at least two capacitors are partitioned into at least two groups of capacitor units, which are formed tangling with each other to form a 2D or 3D mesh structure that can lower the relative capacitance variation between the capacitors including both the local capacitance variation and the global capacitance variation. Thus, a capacitance mismatch problem can be prevented more effectively, and the performances of the products can be made more uniform.

It is to be understood that both the foregoing general description and the following detailed description are exemplary, and are intended to provide further explanation of the invention as claimed.

DESCRIPTION OF THE PREFERRED EMBODIMENTS

As mentioned above, the principle of reducing the capacitance variations in this invention is to partition each of at least two capacitors with the same capacitance into a group of capacitor units and then arrange and spatially intermix different groups of capacitor units into an array with the capacitor units of the same group electrically connected with each other in parallel. In a preferred embodiment, the capacitor-unit numbers of all of the groups are the same, and the capacitances of all of the capacitor units are also the same for all of the capacitors have the same capacitance.

Figure 8:
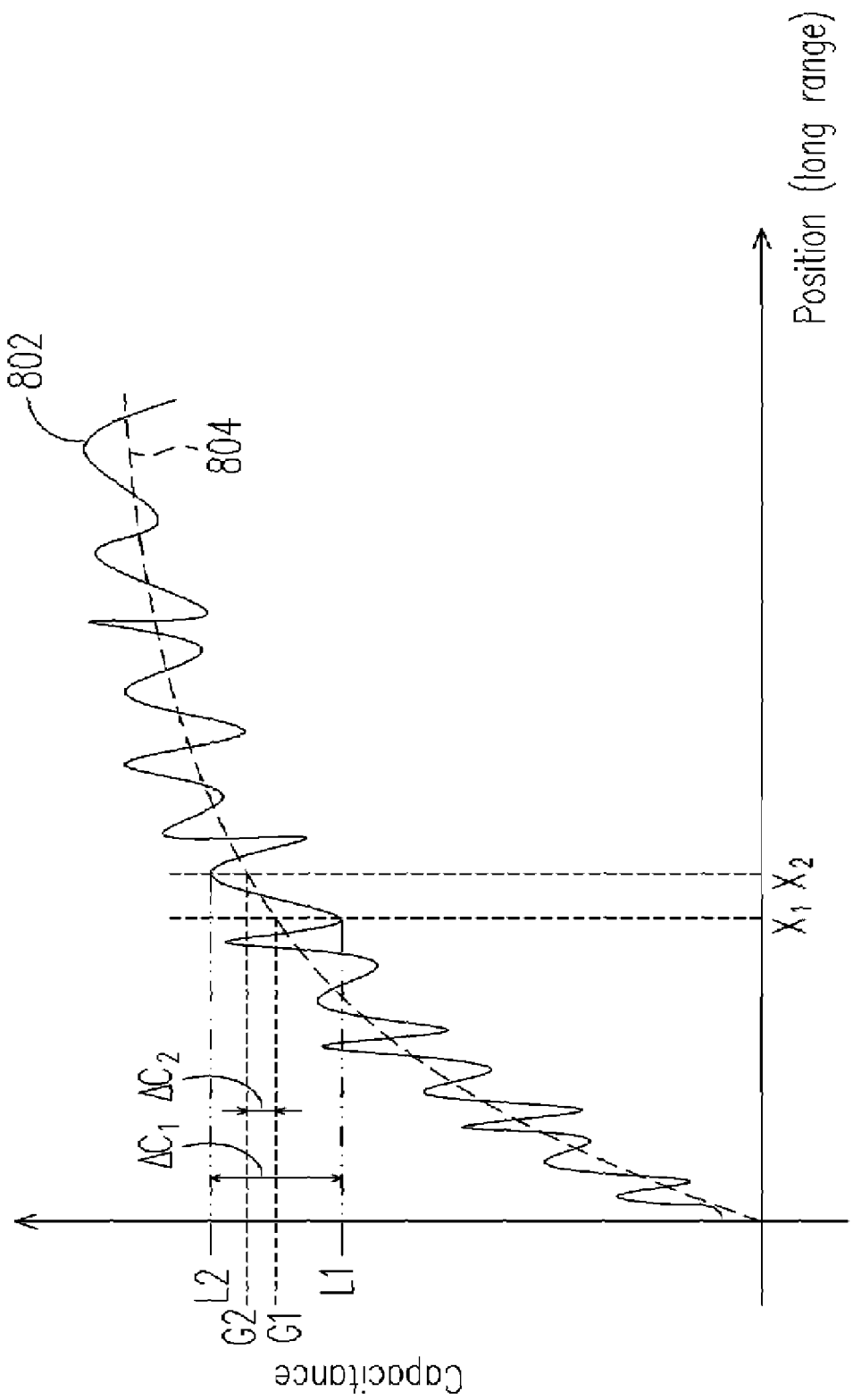
FIG. 8 shows an example of the capacitance of capacitor varying with the position within a long range in the prior art.

The above capacitor set structure can effectively decrease the global capacitance variation, which is explained below in reference of FIG. 8 that shows an example of the capacitance varying with the position within a long range in the prior art. In FIG. 8, the capacitance curve 802 is fluctuant because of the local capacitance variation, and the dashed curve 804 represents long-range capacitance change corresponding to the global capacitance variation. The relative capacitance variation between the two positions $X_1$ and $X_2$ caused by the short-range capacitance change is $\Delta C_1$ that is the difference between L1 and L2, while that caused by the long-range capacitance change is $\Delta C_2$ that is the difference between G1 and G2 and is smaller than $\Delta C_1$. This means that decreasing the distance, which is equivalent to reducing the area, can lower the global capacitance variation. Therefore, by dividing the first and the second capacitors respectively into multiple first and second capacitor units, the global capacitance variation between the capacitors is decreased due to the reduced area.

It is also noted that though each of the capacitor sets described in the following embodiments includes only two capacitors with the same capacitance, a capacitor set including more than two capacitors with the same capacitance can be readily constituted based on this invention with suitable wiring structures for electrically connecting all units of the same capacitor in parallel.

Figure 1:
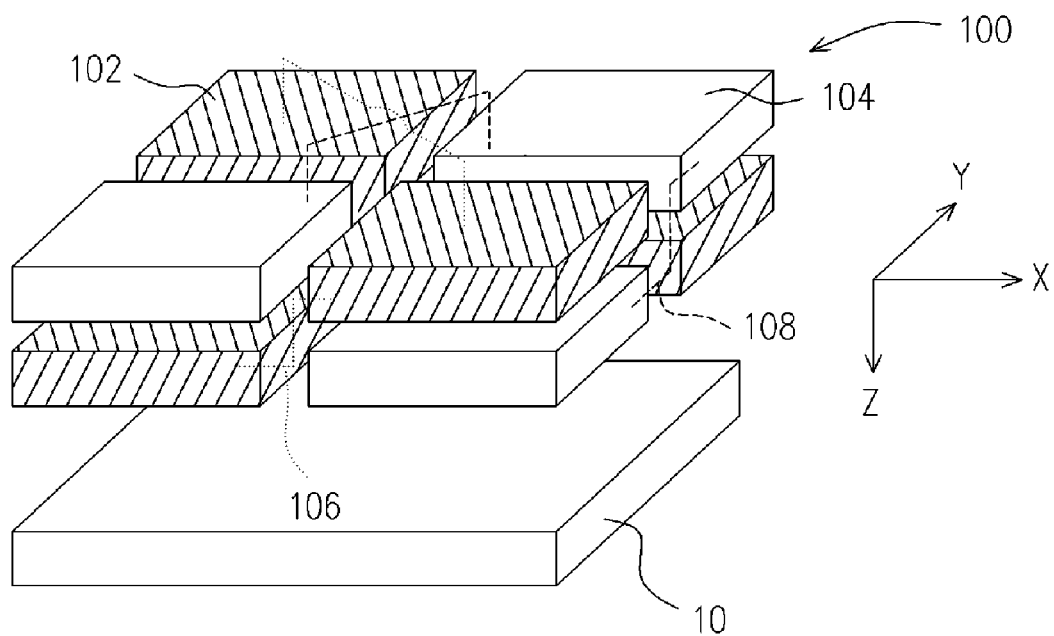
FIGS. 1-3 illustrate the structures of three capacitor sets respectively according to three embodiments of this invention.

FIG. 1 illustrates the structure of a capacitor set according to an embodiment of this invention. The capacitor set 100 includes multiple first capacitor units 102 and second capacitor units 104 disposed on a substrate 10, wherein the first capacitor units 102 and the second capacitor units 104 are the same in number and in the capacitance per capacitor unit. The first capacitor units 102 are electrically connected with each other in parallel, as indicated by dotted lines 106, to form a first capacitor. The second capacitor units 102 are electrically connected with each other in parallel, as indicated by dash lines 108, to form a second capacitor. In this embodiment, the first capacitor units 102 and the second capacitor units 104 are arranged alternately in each of the three dimensional directions of the 3D array, so that the first and the second capacitors are at the same position on the substrate 10. The above three dimensional directions usually include two directions parallel to the surface of the substrate 10 and perpendicular to each other, and one direction perpendicular to the surface of the substrate 10.

Figure 2:
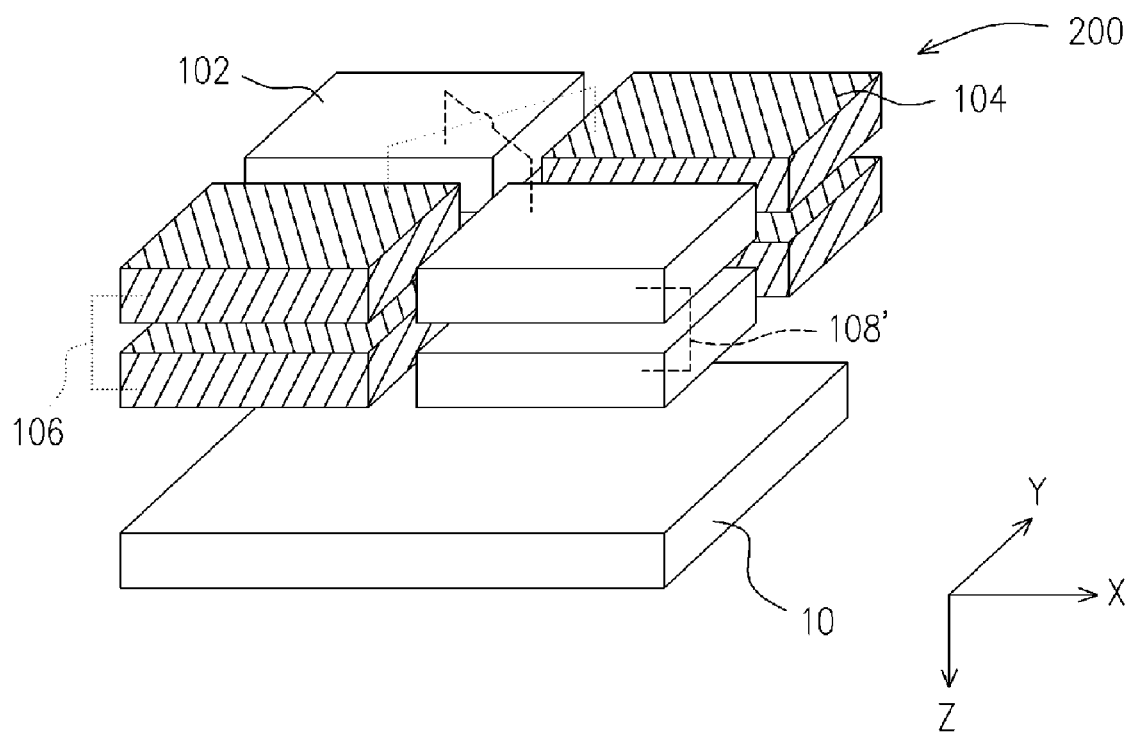

FIG. 2 illustrates the structure of a capacitor set of another embodiment of this invention. The capacitor set is different from that in FIG. 1 in that the first capacitor units 102 and the second capacitor units 104 are arranged repeatedly in the direction perpendicular to the surface of the substrate 10. The electrical connections between the first/second capacitor units 102/104 are indicated by dotted/dash lines 106'/108'.

Figure 3:
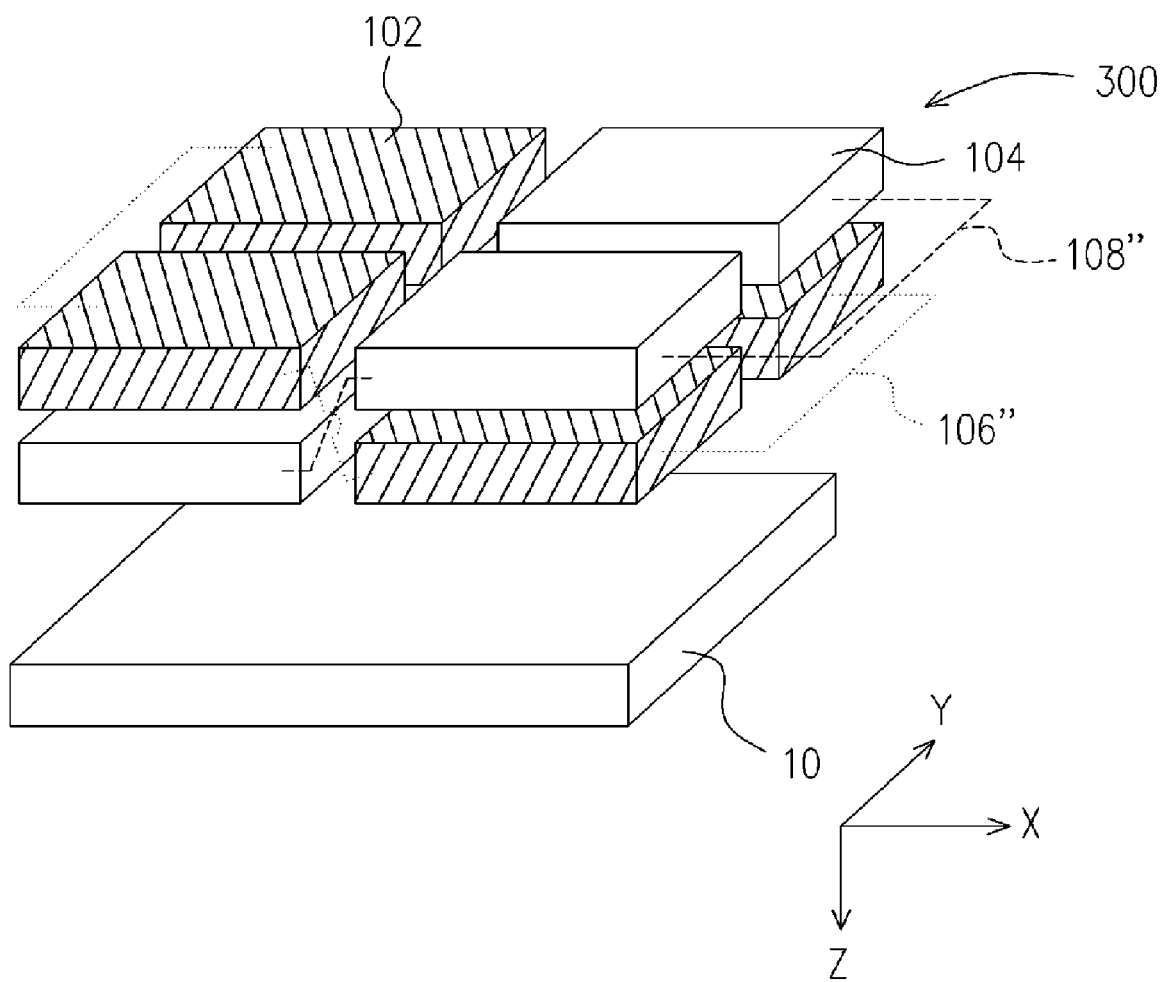

FIG. 3 illustrates the structure of a capacitor set according to still another embodiment. The capacitor set is different from that in FIG. 1 in that the first capacitor units 102 and the second capacitor units 104 are arranged repeatedly in a horizontal direction parallel to the surface of the substrate 10. The electrical connections between the first/second capacitor units 102/104 are indicated by dotted/dash lines 106"/108".

It is noted that though each of the embodiments takes a 2×2×2 array including 4 first capacitor units and 4 second capacitor units as an example to explain this invention, the capacitor set of this invention can be a $N_1 \times N_2 \times N_3$ array where each of $N_1$ to $N_3$ is equal to two or a larger integer and $N_1$ to $N_3$ are not simultaneously equal to two.

The capacitor set structure may alternatively be a 2D array in one plane, i.e., a $M_1 \times M_2$ ($M_1, M_2 \geq 2$) array, where the plane may be one parallel or perpendicular to the substrate surface. A 2D array arranged in a plane parallel to the substrate surface may be one constituted of four capacitor units in one level of the stacked structure in FIG. 1 or 2, while that in a plane perpendicular to the substrate surface may be one constituted of four capacitor units arranged in one XZ plane of FIG. 3.

In addition, the first and second capacitors may be MOM or MIM capacitors, i.e., the first and second capacitor units may be MOM- or MIM-type capacitor units. One first capacitor unit 102 may include a first electrode, a second electrode and a dielectric material between them, and one second capacitor unit 102 may include a third electrode, a fourth electrode and the dielectric material between them. Each of the first to fourth electrodes may include a metal layer, and the dielectric material may be silicon oxide or other insulating material.

When the first and the second capacitors are MOM capacitors, for example, one first/second capacitor unit 102/104 may have the structure 402, 404, 406 or 408 shown in FIGS. 4A-4D or any other structure allowing two units of the same capacitor to be connected in parallel. The structure 402 includes a comb-like electrode 402a, another comb-like electrode 402c opposite to 402a and an oxide layer 402b between them, and each of the structures 404, 406 and 408 also includes two electrodes complementary in their shapes and an oxide layer between them. The number of the branches of each electrode as well as the area and capacitance of each capacitor unit are not particularly restricted, and can be adjusted according to the requirements in circuit design.

Figure 4A:
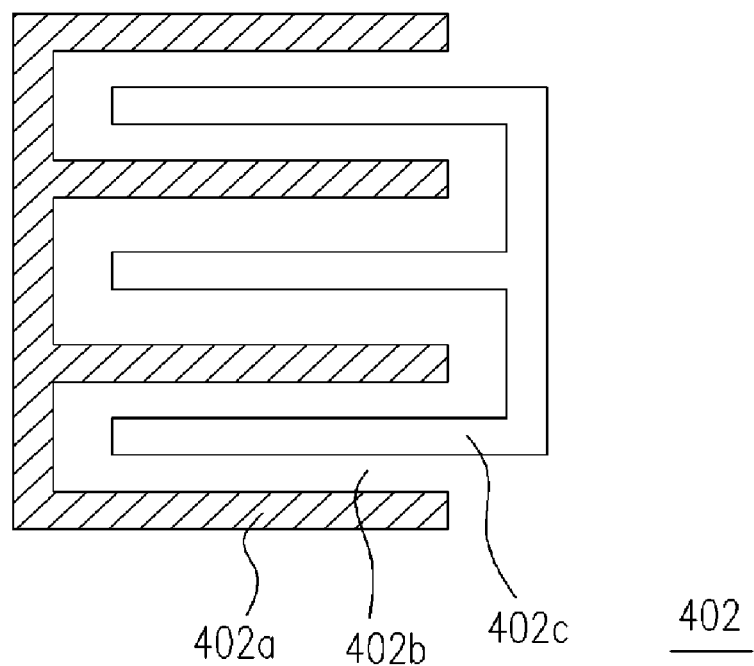
FIGS. 4A-4D illustrate four examples of capacitor unit structures according to an embodiment of this invention.
Figure 4B:
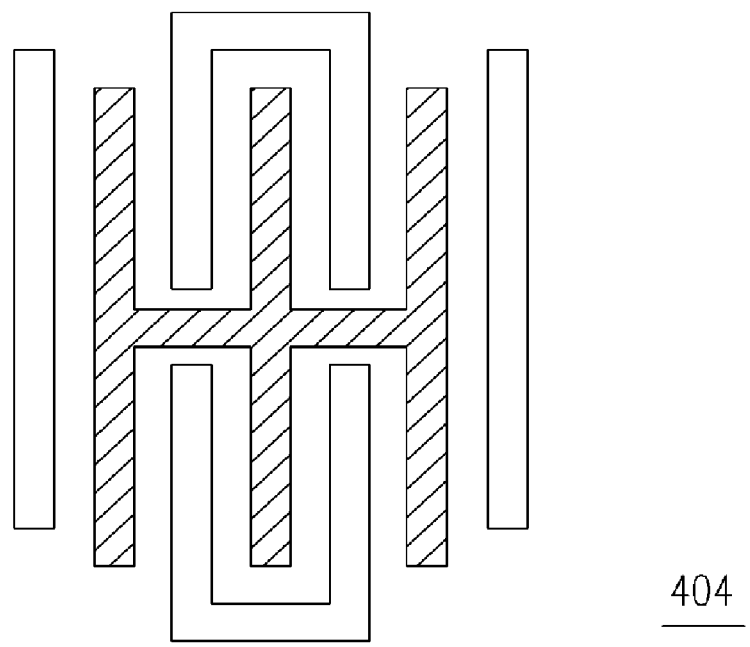
Figure 4C:
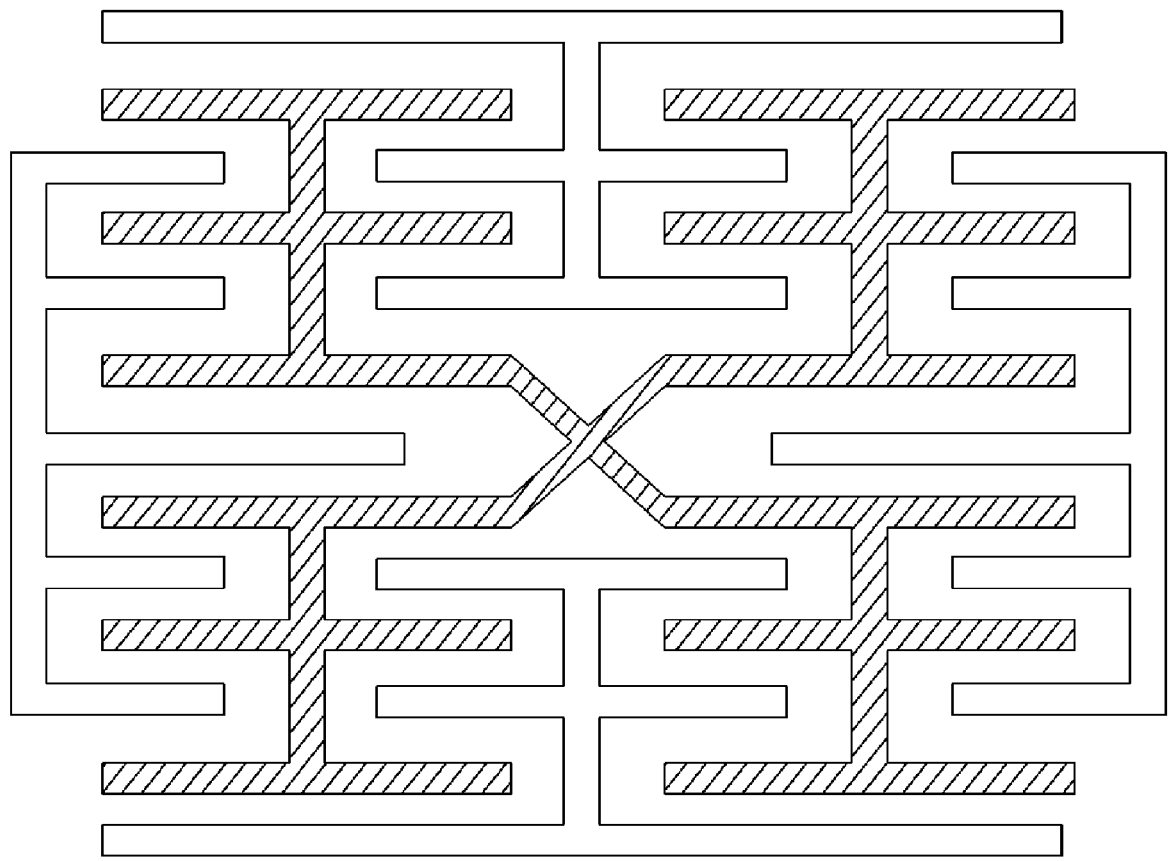
Figure 4D:
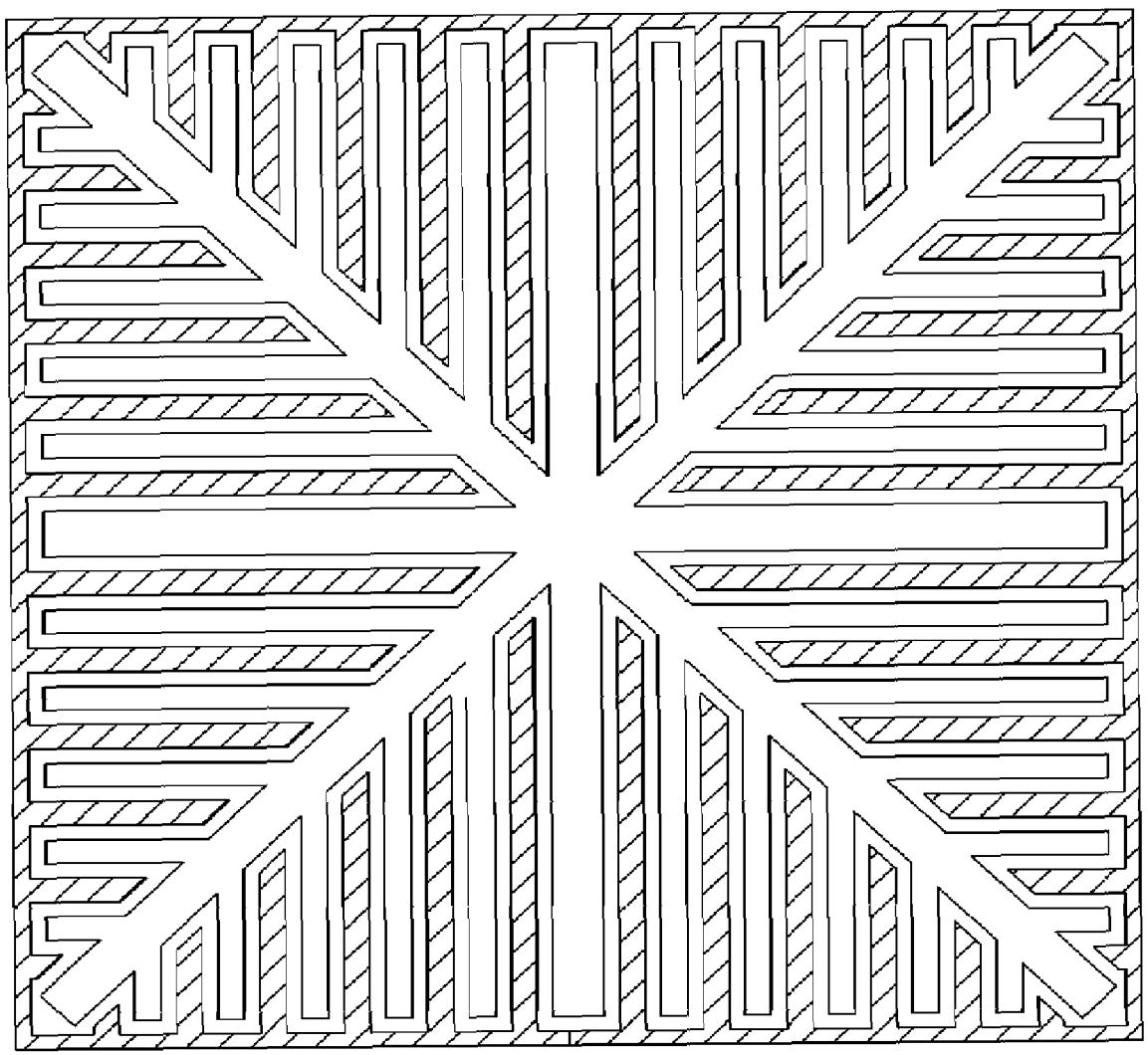
Figure 5:
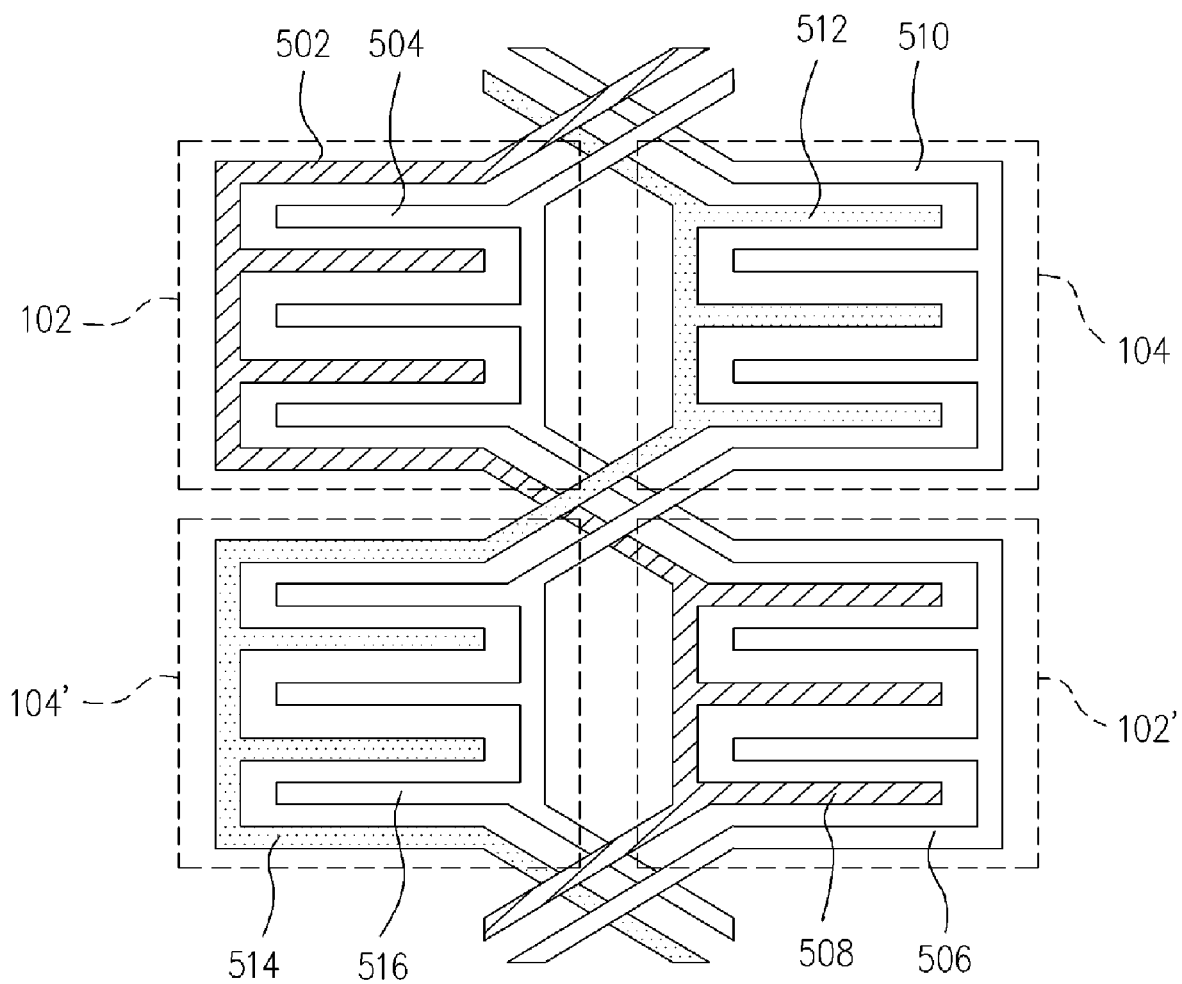
FIG. 5 illustrates a possible connection mode between the capacitor units in one level of a capacitor set with the same capacitor unit arrangement in FIG. 2 and with the electrode structures in FIG. 4A.

Next, a wiring structure for electrically connecting all of the first capacitor units in parallel and simultaneously connecting all of the second capacitor units in parallel is exemplified, wherein the first and the second capacitor units are arranged as in FIG. 2 and each capacitor unit has the structure of FIG. 4A. Referring to FIG. 5 that shows the connections between the capacitor units in the same level of the capacitor set, the two first capacitor units 102 and 102' positioned diagonally are electrically connected with each other in parallel, and the two second capacitor units 104 and 104' also positioned diagonally are connected with each other in parallel.

More specifically, one electrode 502 of the first capacitor unit 102 is connected with one electrode 508 of the first capacitor unit 102', and the other electrode 504 of the first capacitor unit 102 is connected with the other electrode 506 of the first capacitor unit 102'. Meanwhile, one electrode 510 of the second capacitor unit 104 is connected with one electrode 516 of the second capacitor unit 104', and the other electrode 512 of the second capacitor unit 104 is connected with the other electrode 514 of the second capacitor units 104'. The first wires between the two first capacitor units 102 and 102' cross with the second wires between the second capacitor units 104 and 104', and such a structure may be constituted by forming the first (or second) wires in the same level of the electrodes 502-516 and forming the second (or first) wires in the precedent or next level of the electrodes 502-516.

Figure 6A:
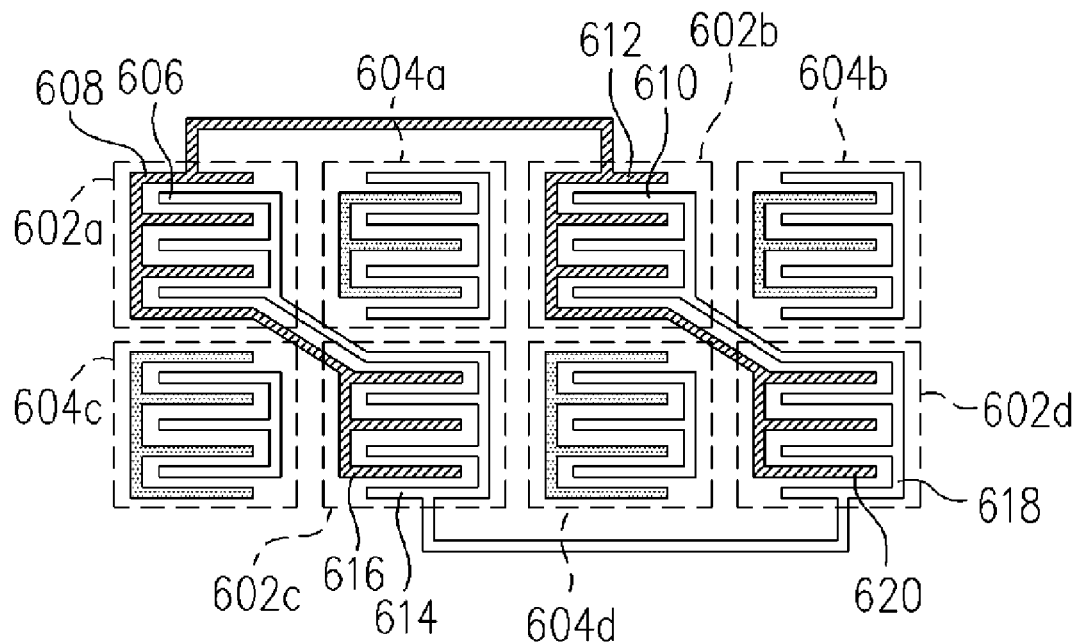
FIGS. 6A and 6B illustrate a possible connection mode between the capacitor units in two levels of a capacitor set with the same capacitor unit arrangement in FIG. 2 and with the electrode structures in FIG. 4A.
Figure 6B:
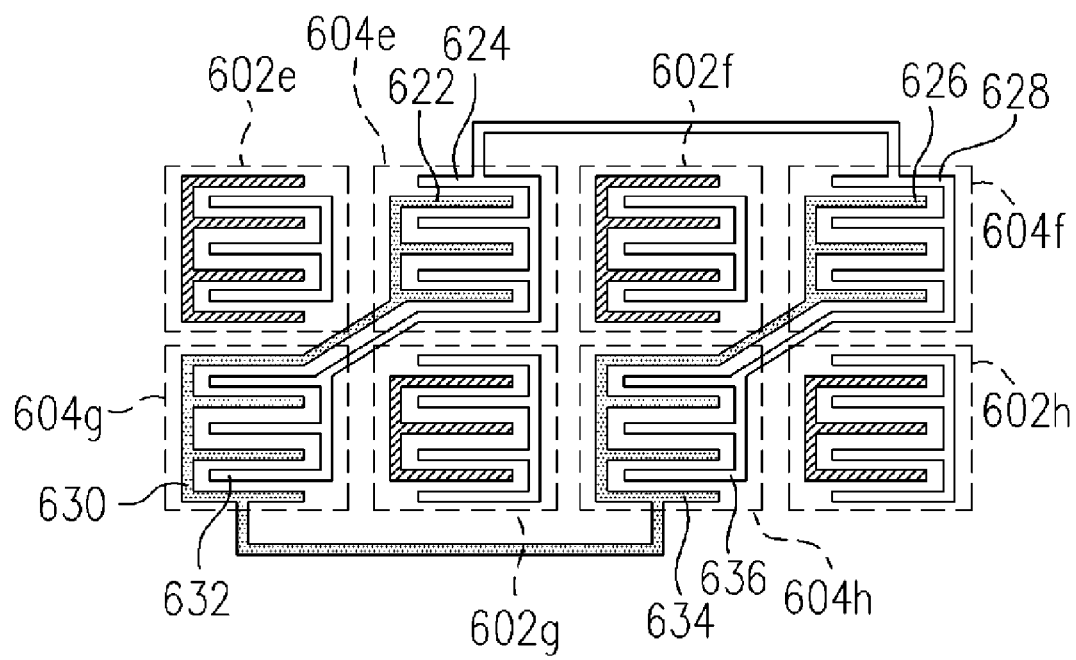
Figure 7:
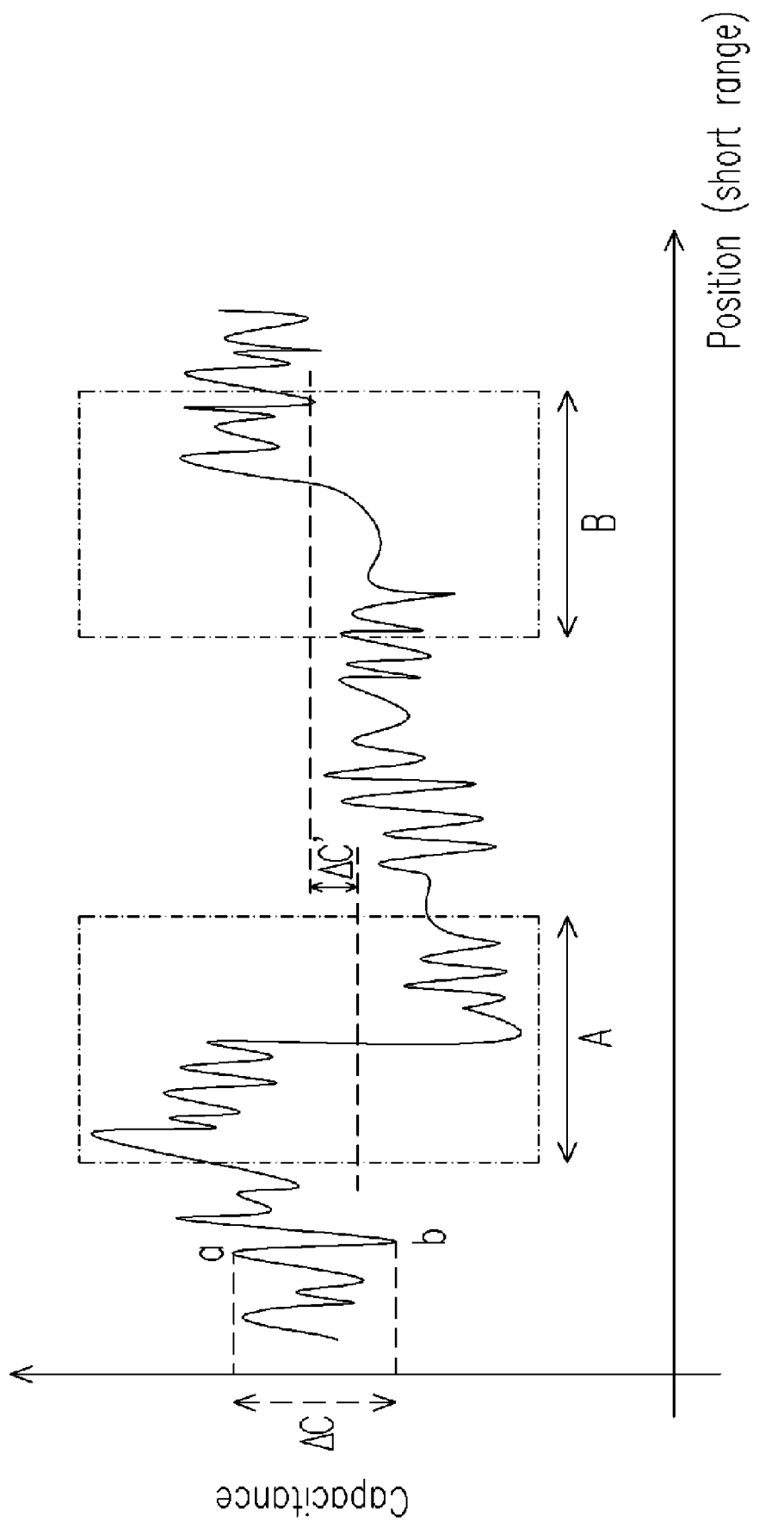
FIG. 7 shows an example of the capacitance of capacitor varying with the position within a short range in the prior art.

In another embodiment where the first and second capacitor units are arranged as in FIG. 2 and each capacitor unit has the structure of FIG. 4A, the connections between the first capacitor units and between the second ones are as follows. FIGS. 6A and 6B each illustrates a possible arrangement/connection mode between the capacitor units in one of the two levels of capacitor units in FIG. 2. Referring to FIG. 6A, the upper-level structure includes four first capacitor units 602a, 602c, 602b and 602d arranged in sequence with any two adjacent units in diagonal, and four second capacitor units 604c, 604a, 604d and 604b arranged in sequence with any two adjacent units in diagonal. The capacitor units 602a, 602c, 602b and 602d are connected to each other in parallel in the following manner. The electrode 606 of the first capacitor unit 602a is connected with the electrode 614 of the adjacent first capacitor unit 602c, and the other electrode 608 of the former connected with the other electrode 616 of the latter. The electrode 610 of the first capacitor unit 602b is connected with the electrode 618 of the adjacent first capacitor unit 602d, and the other electrode 612 of the former connected with the other electrode 620 of the latter. One electrode 608 of the first capacitor unit 602a is connected with the corresponding electrode 612 of the non-adjacent first capacitor unit 602b via a conductive line disposed outside the region of the eight capacitor units. One electrode 614 of the first capacitor unit 602c is connected with the corresponding electrode 618 of the non-adjacent first capacitor unit 602d also via a conductive line disposed outside the region of the eight capacitor units.

Referring to FIG. 6B, the lower-level structure includes four first capacitor units 602e, 602g, 602f and 602h arranged in sequence with any two adjacent units in diagonal, and four second capacitor units 604g, 604e, 604h and 604f arranged in sequence with any two adjacent units in diagonal. The capacitor units 604g, 604e, 604h and 604f are connected to each other in parallel in the following manner. The electrode 622 of the first capacitor unit 604e is connected with the electrode 630 of the adjacent first capacitor unit 604g, and the other electrode 624 of the former connected with the other electrode 632 of the latter. The electrode 626 of the first capacitor unit 604f is connected with the electrode 634 of the adjacent first capacitor unit 604h, and the other electrode 628 of the former connected with the other electrode 636 of the latter. One electrode 624 of the first capacitor unit 604e is connected with the corresponding electrode 628 of the non-adjacent first capacitor unit 604f via a conductive line disposed outside the region of the eight capacitor units. One electrode 630 of the first capacitor unit 604g is connected with the corresponding electrode 634 of the non-adjacent first capacitor unit 604h also via a conductive line disposed outside the region of the eight capacitor units.

Moreover, the upper four first capacitor units 602a, 602b, 602c and 602d are respectively coupled with the lower four first capacitor units 602e, 602f, 602g and 602h through via plugs (not shown), and the upper four second capacitor units 604a, 604b, 604c and 604d are respectively coupled with the lower four second capacitor units 604e, 604f, 604g and 604h through via plugs (not shown). For a pair of upper and lower capacitor units coupled to each other, each of the two electrodes of the upper capacitor unit is connected with a corresponding one of the two electrodes of the lower capacitor unit through one or more via plugs.

Since each capacitor in a capacitor set of this invention is formed based on multiple capacitor units with a much smaller area, the global capacitance variation achieved with this invention is lower than that achieved in the prior art. Moreover, because the units of different capacitors in the capacitor set are arranged spatially intermixing with each other to form a 2D or 3D mesh structure, the local capacitance variation and the global capacitance variation are reduced simultaneously. Thus, a capacitance mismatch problem can be prevented more effectively, and the performances of the products can be made more uniform.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for reducing capacitance variations of capacitors, comprising:
   forming at least a first capacitor set and a second capacitor set on a substrate, comprising:
   forming a plurality of first capacitor units connected in parallel to constitute the first capacitor set and forming a plurality of second capacitor units connected in parrallel to constitute the second capacitor set,
   wherein the first capacitor units and the second capacitor units are the same in number, have identical capacitance per capacitor unit, and are spatially intermixed with each other to form a multidimensional array.

2. The method of claim 1, wherein the first and the second capacitor units are arranged in a two-dimensional (2D) array in one plane.

3. The method of claim 2, wherein the one plane is parallel or perpendicular to a surface of the substrate.

4. The method of claim 1, wherein the first and the second capacitor units are arranged in a three-dimensional (3D) array.

5. The method of claim 4, wherein the first and the second capacitor units are arranged alternately in a first and a second dimensional directions of the 3D array but repeatedly in a third dimensional direction of the 3D array.

6. The method of claim 5, wherein the first and the second dimensional directions are parallel to a surface of the substrate, and the third dimensional direction is perpendicular to the surface of the substrate.

7. The method of claim 5, wherein the first and the third dimensional directions are parallel to a surface of the substrate, and the second dimensional direction is perpendicular to the surface of the substrate.

8. The method of claim 1, wherein the first and the second capacitors comprise MOM capacitors.

9. The method of claim 1, wherein the first and the second capacitors comprise MIM capacitors.

10. The method of claim 1, wherein
each of the first capacitor units comprises a first electrode, a second electrode and a dielectric material between the first and the second electrodes;
each of the second capacitor units comprises a third electrode, a fourth electrode and the dielectric material between the third and the fourth electrodes;
in the first capacitor units, all of the first electrodes are electrically connected with each other and all of the second electrodes are electrically connected with each other; and
in the second capacitor units, all of the third electrodes are electrically connected with each other and all of the fourth electrodes are electrically connected with each other.

11. The method of claim 10, wherein the first and the second capacitors comprise MOM capacitors, and each of the first to fourth electrodes has a comb-like structure.

12. A method for reducing capacitance variations of capacitors, comprising:
forming a plurality of first capacitor units in communication with each other on a substrate, the plurality of first capacitor units being spatially isolated from each other; and
forming a plurality of second capacitor units in communication with each other on the substrate, the plurality of second capacitor units being spatially isolated from each other and electrically isolated from the plurality of first capacitor units;
wherein the first capacitor units and the second capacitor units are the same in number, have identical capacitance per capacitor unit, and are spatially intermixed with each other to form a multidimensional array.

13. The method of claim 12, wherein the first and the second capacitor units are arranged in a two-dimensional (2D) array in one plane.

14. The method of claim 13, wherein the one plane is parallel or perpendicular to a surface of the substrate.

15. The method of claim 12, wherein the first and the second capacitor units are arranged in a three-dimensional (3D) array.

16. The method of claim 15, wherein the first and the second capacitor units are arranged alternately in a first and a second dimensional directions of the 3D array but repeatedly in a third dimensional direction of the 3D array.

17. The method of claim 16, wherein the first and the second dimensional directions are parallel to a surface of the substrate, and the third dimensional direction is perpendicular to the surface of the substrate.

18. The method of claim 16, wherein the first and the third dimensional directions are parallel to a surface of the substrate, and the second dimensional direction is perpendicular to the surface of the substrate.

19. The method of claim 12, wherein the first and the second capacitors units comprise MOM capacitors.

20. The method of claim 12, wherein the first and the second capacitors units comprise MIM capacitors.

21. The method of claim 12, wherein
each of the first capacitor units comprises a first electrode, a second electrode and a dielectric material between the first and the second electrodes;
each of the second capacitor units comprises a third electrode, a fourth electrode and the dielectric material between the third and the fourth electrodes;
in the first capacitor units, all of the first electrodes are electrically connected with each other and all of the second electrodes are electrically connected with each other; and
in the second capacitor units, all of the third electrodes are electrically connected with each other and all of the fourth electrodes are electrically connected with each other.

22. The method of claim 21, wherein the first and the second capacitor units comprise MOM capacitors, and each of the first to fourth electrodes has a comb-like structure.

23. A method for reducing capacitance variations of capacitors, comprising:
forming at least a first capacitor set and a second capacitor set on a substrate, comprising:
forming a plurality of first capacitor units connected in parallel to constitute the first capacitor set and forming a plurality of second capacitor units connected in parallel to constitute the second capacitor set,
wherein the first capacitor units and the second capacitor units are the same in number, have identical capacitance per capacitor unit, and are spatially intermixed with each other to form a multidimensional array, the first and the second capacitor units are arranged in a three-dimensional (3D) array and are arranged alternately in each of three dimensional directions of the 3D array.

24. The method of claim 23, wherein the three dimensional directions are perpendicular to each other and include two directions parallel to a surface of the substrate and one direction perpendicular to the surface of the substrate.

25. A method for reducing capacitance variations of capacitors, comprising:
forming a plurality of first capacitor units in communication with each other on a substrate, the plurality of first capacitor units being spatially isolated from each other; and
forming a plurality of second capacitor units in communication with each other on the substrate, the plurality of second capacitor units being spatially isolated from each other and electrically isolated from the plurality of first capacitor units;
wherein the first capacitor units and the second capacitor units are the same in number, have identical capacitance per capacitor unit, and are spatially intermixed with each other to form a multidimensional array, the first and the second capacitor units are arranged in a three-dimensional (3D) array and are arranged alternately in each of three dimensional directions of the 3D array.

26. The method of claim 25, wherein the three dimensional directions are perpendicular to each other and include two directions parallel to a surface of the substrate and one direction perpendicular to the surface of the substrate.

* * * * *